(12) United States Patent
Butscher et al.

(10) Patent No.: US 9,298,109 B2
(45) Date of Patent: Mar. 29, 2016

(54) EUV LITHOGRAPHY APPARATUS AND METHOD FOR DETECTING PARTICLES IN AN EUV LITHOGRAPHY APPARATUS

(71) Applicant: CARL ZEISS SMT GmbH, Oberkochen (DE)

(72) Inventors: Vera Butscher, Aalen (DE); Dirk Heinrich Ehm, Lauchheim (DE)

(73) Assignee: Carl Zeiss SMT GmbH, Oberkochen (DE)

(*) Notice: Subject to any disclaimer, the term of this patent is extended or adjusted under 35 U.S.C. 154(b) by 336 days.

(21) Appl. No.: 13/917,788

(22) Filed: Jun. 14, 2013

(65) Prior Publication Data
US 2014/0028989 A1    Jan. 30, 2014

Related U.S. Application Data

(60) Provisional application No. 61/659,735, filed on Jun. 14, 2012.

(30) Foreign Application Priority Data

Jun. 14, 2012 (DE) .......... 10 2012 210 035

(51) Int. Cl.
*G03F 7/20* (2006.01)
*G03G 15/00* (2006.01)

(52) U.S. Cl.
CPC .......... *G03F 7/7085* (2013.01); *G03F 7/70908* (2013.01); *G03F 7/70983* (2013.01); *G03G 15/00* (2013.01)

(58) Field of Classification Search
CPC . G03F 7/70033; G03F 7/702; G03F 7/70233; G03F 7/70916; G03F 7/70941; G03F 7/70925; G03F 7/70933; G03F 7/7085; G03F 7/70908
See application file for complete search history.

(56) References Cited

U.S. PATENT DOCUMENTS

| | | | |
|---|---|---|---|
| 5,459,771 A | 10/1995 | Richardson et al. | |
| 5,953,591 A * | 9/1999 | Ishihara et al. | ............... 438/115 |
| 7,508,487 B2 * | 3/2009 | Mulkens et al. | ................ 355/30 |
| 2004/0160583 A1 * | 8/2004 | Hubertus Mulkens | ............. G03F 7/70558 355/30 |
| 2005/0083504 A1 * | 4/2005 | Moors | ................. G03F 7/70916 355/67 |
| 2010/0034349 A1 * | 2/2010 | Kraus | .................... G01N 21/67 378/41 |

FOREIGN PATENT DOCUMENTS

WO    2009152885 A1    12/2009

* cited by examiner

Primary Examiner — Steven H Whitesell Gordon
(74) Attorney, Agent, or Firm — Edell, Shapiro & Finnan, LLC

(57) ABSTRACT

An EUV lithography apparatus (1) includes: a light source (15) for generating radiation (17) for the illumination of particles (P) present in the gas phase and present in the EUV lithography apparatus (1) along a light area (18), and a detector, for detecting radiation (17*a*) from the light source (15) that is scattered at the illuminated particles (P) in a test region (19) captured by the detector. Also, a method for detecting particles (P) in an EUV lithography apparatus (1) includes: producing a light area (18) for illuminating the particles (P) present in the gas phase, detecting radiation (17*a*) scattered at the illuminated particles (P) in a test region (19), and determining a number (N) of particles in the test region (19) on the basis of the detected radiation (17*a*).

22 Claims, 2 Drawing Sheets

EUV LITHOGRAPHY APPARATUS AND METHOD FOR DETECTING PARTICLES IN AN EUV LITHOGRAPHY APPARATUS

The present application claims priority from German Patent Application No. 10 2012 210 035.0, filed on Jun. 14, 2012, and U.S. Provisional Application No. 61/659,735, also filed on Jun. 14, 2012, the entire disclosures of which are incorporated herein by reference.

FIELD OF AND BACKGROUND OF THE INVENTION

The invention relates to an EUV lithography apparatus and to a method for detecting particles present in the gas phase in an EUV lithography apparatus.

Although EUV lithography apparatuses are typically operated under vacuum conditions at (total) pressures of between approximately $10^{-9}$ mbar and approximately $10^{-1}$ mbar, contaminating substances, in particular contaminating particles, can pass into the interior of the EUV lithography apparatus (for example into the beam shaping system, the illumination system or the projection system) or can be formed there. If a large number of such particles present in the gas phase deposit on optical surfaces of optical elements present in the EUV lithography apparatus, this has a disadvantageous effect on the operation of the EUV lithography apparatus.

There are various causes or sources of contaminating substances or contaminating particles: it is known, for example, that light sources for EUV lithography apparatuses can be designed as plasma light sources. In the case of EUV plasma light sources (LPP, "Laser Produced Plasma"), droplets of molten tin are impinged upon by a pulsed carbon-dioxide high-power laser and evaporated in order to generate EUV radiation having a maximum intensity in the EUV spectral range between approximately 5 nm and approximately 20 nm. In the case of such light sources, tin particles from the vicinity of the light source can pass into the beam shaping system, in which the light source is situated, and from there via the illumination system right into the projection system.

In EUV lithography apparatuses, reflective elements, in particular mirrors, are typically used as optical elements since no optical materials having a sufficiently high transmission exist at the wavelengths used there. Such optical elements can be arranged in a mechanically pivotable manner in order to be able to influence the beam path in the interior of the EUV lithography apparatus. By way of example, so-called facet mirrors can be provided in the illumination system, said facet mirrors having a plurality of tiltable individual mirrors in order to realize different illumination settings. In the course of the tilting of the individual mirrors, mechanical abrasion in the form of particles may possibly be established, said particles merging with the residual gas atmosphere. Also, the substrate ("wafer") to be patterned or a light-sensitive layer ("resist") provided thereon or components incorporated in the EUV lithography apparatus can outgas contaminating substances or particles which can deposit on optical surfaces and can have a disadvantageous effect on the operation thereof in the EUV lithography apparatus.

The contaminating substances or particles can be, inter alia, heavy hydrocarbons which, under irradiation with EUV radiation, deposit as solid carbon on the mirror surfaces, as a result of which the reflectivity of the mirrors decreases in a detrimental manner. Such deposits may possibly not be completely removed from the optical surfaces even in the event of cleaning, with the result that the lifetime of the optical elements decreases. Contamination by the deposition of particles can affect not only mirror elements but also the (reflective) mask whose structure is intended to be transferred to the substrate to be patterned, and also the wafer or the light-sensitive substrate.

OBJECTS AND SUMMARY OF THE INVENTION

It is an object of the invention to provide an EUV lightography apparatus and a method for detecting particles in an EUV lightography apparatus in order to enable the process-reliable operation thereof.

This object is achieved by an EUV lithography apparatus, comprising: a light source for generating radiation for the illumination of particles present in the gas phase and present in the EUV lithography apparatus along a light area, and a detector, in particular a camera, for detecting radiation from the light source that is scattered at the illuminated particles in a test region captured by the detector.

In order to make a statement about the particles, in particular about the number of particles present in the EUV lithography apparatus, radiation is generated by the light source and a substantially two-dimensional radiation distribution, which is designated as a light area, is generated for example with the aid of an optical unit for beam expansion. The substantially two-dimensional light area can extend in a plane, but if appropriate it is also possible to produce approximately two-dimensional light areas having a curvature.

Particles present in the gas phase which stay in the region of the light area, in particular in the plane of the light area, are illuminated by the radiation from the light source and the radiation from the light source is scattered at said particles. The detector, e.g. a camera, can detect or capture the radiation scattered or reflected at the illuminated particles. The detector generally has a capture region determined by its viewing angle, in which capture region said detector can record scattered radiation. Said capture region is oriented toward the light area and intersects the latter in a region designated as a test region. Particles can be detected in said test region, e.g. in order to determine a number of particles and/or a flow direction of the particles.

As a result of the recording or the detection of the particles, it is thus advantageously possible to obtain information about the whereabouts of particles in the test region or (in an extrapolated manner) in a specific test volume. This allows the determination of a contamination state present at the time of recording in the test region and, under specific assumptions (or, if appropriate, by varying the position of the test region) also a determination of the contamination state of a larger test volume in a part of the EUV lithography apparatus. A conclusion about the contaminations in the entire EUV lithography apparatus can be drawn from the monitoring of the test region, depending on where the test region is arranged in the EUV lithography apparatus or on the size of said test region, and depending on what assumptions are made with regard to the propagation of particles in the overall system.

As described further above, for the purpose of producing a light area a beam shaping optical unit can be provided, which fans out the radiation emitted by the light source into a thin sheet (typically having a thickness of between approximately 1 mm and 10 mm). The thickness of the light area should be, in particular, within the depth of field of the camera used. Small thicknesses of possibly down to approximately 0.05 mm can be used in order to achieve a high spatial resolution, which is advantageous in particular for flow visualization. In the latter case, the light area is (almost) a two-dimensional area. The extent of the light area transversely with respect to the thickness direction is in any case greater than that in the thickness direction, and the extent of the light area transversely with respect to the thickness direction can be in the range of a number of centimeters. The sensitivity of the detector is typically coordinated with the wavelength range of the light source (the sensitivity of a camera used as the detector depends, inter alia, on the type of camera, such as CCD or CMOS). As a result, particularly small particles (diameters of down to 250 nm in size, in particular cases even down to 60 nm in size) can advantageously be detected. The detection of particles is possible in particular even at comparatively high particle velocities of e.g. approximately 300 m/s.

In one preferred embodiment of the EUV lithography apparatus, the light source is a laser. If the light source is a laser, then light area production with a precisely predefined wavelength is advantageously possible. Since, during the detection of the particles in the gas phase, the detector captures the so-called scattering diameter rather than the real particle diameter and said scattering diameter depends, inter alia, on the ratio of the particle diameter to the wavelength of the light source radiation, it is advantageous to use radiation having a single wavelength for the illumination.

Furthermore, laser light sources have comparatively high powers and can (together with a suitable optical unit) be used for producing a very thin light area or light sheet (typically between approximately 1 mm and 10 mm, possibly down to approximately 0.05 mm) (see above). High powers are advantageous in order still to detect particularly small particles (sizes down to 250 nm or even 60 nm) as well. Suitable laser light sources are, for example, frequency-doubled pulsed Nd:YAG or ND:YLF lasers having wavelengths of e.g. 532 nm. Although the test region is typically formed in a region which is evacuated during the operation of the EUV lithography apparatus, in particular in an evacuated chamber, the light source can, if appropriate, also be arranged outside the evacuated region. The feeding of the radiation into the chamber can be introduced into the chamber e.g. through an inspection window which is provided in the chamber and which is transparent to the radiation, or in some other way, e.g. through an optical fiber. If appropriate, the detector here too, can be arranged outside the evacuated chamber and capture the test region via an inspection window.

In order to observe particles, in particular particle flows, it is known to use a visualization technique, also designated as "particle image velocimetry", PIV. This technique involves adding particles to a gas volume to be examined, which follow a gas flow possibly present there and thus allow statements to be made about the flow behavior (in particular the particle velocities). The detector and the (laser) light source used in the EUV lithography apparatus can be designed as in the PIV method. In the present application, however, tracer particles are not used, rather the particle background present in the EUV lithography apparatus is detected directly (in situ).

In another preferred embodiment, the light source is an EUV light source of the EUV lithography apparatus for producing a structure on a substrate. This has the advantage that no additional light source need be introduced into the EUV lithography apparatus, with the result that a statement about undesirable particles present in the EUV lithography apparatus can be made in a cost-effective manner. Plasma light sources, in particular, have proved to be worthwhile in practice as EUV light sources. In general, in this variant no beam shaping optical unit is used and the light area is produced in proximity to an intermediate focus at which a sufficiently high radiation power is present. For the detection of EUV radiation scattered at the particles, a detector which is sensitive in this wavelength range or, if appropriate, a suitable frequency-converting element (scintillator, etc.) can be used.

In one development, the light source is designed to produce a plurality of light areas in successive illumination intervals, in particular in pulsed operation. As a result, the statement about the particles in the EUV lithography apparatus is not restricted to a single viewing instant or a single illumination interval, rather a plurality of temporally successive viewing instants can be captured. This advantageously allows an assessment of the temporal profile of the whereabouts of particles in the test region. An illumination interval is understood to mean the generation of radiation by the light source during a short duration (if the light source is a laser light source, laser pulses having a duration of 6 to 10 ns can be involved, for example).

If the illumination intervals succeed one another in pulsed operation, i.e. periodically with a specific frequency, then a precise assessment of the temporal profile of the number of particles in the test volume monitored is possible. In particular, by choosing a sufficiently high illumination frequency, it is possible to ensure that the number of particles in the EUV lithography apparatus does not differ to an excessively great extent between two illumination intervals. By way of example, pulsed Nd:YAG or ND:YLF lasers are suitable as light sources which can produce light areas, periodically, in pulsed operation (see above). Said lasers have repetition rates of between approximately 0.01 kHz and 10 kHz and wavelengths of e.g. 532 nm.

One development of the EUV lithography apparatus comprises a synchronization device for synchronizing detection intervals of the detector with the illumination intervals of the light source. The synchronization of the detection intervals with the illumination intervals ensures that during the detection of the temporal profile of the particle situation in the EUV lithography apparatus, the successive camera recordings temporally coincide with the successive light area productions and do not fall out of phase. In this case, it is not absolutely necessary that the detection intervals (the camera recordings) have to be of the same temporal length as the illumination intervals of the light area production. All that is crucial is that the respective time intervals temporally overlap at least partly, such that enough time is available for the detection of scattered radiation. Appropriate cameras having a high frame rate include, for example, cameras of the CCD or CMOS type. They are able to make recordings of a few frames per second (fps; unit Hz) up to a few thousand frames per second. Typical values for the frame rate of these types of camera are approximately 5 Hz to 7 kHz. For synchronization, a conventional camera can be used, in principle, the detection intervals of which are set by an external camera triggering unit or the camera triggering unit can be integrated in the camera itself.

Preference is given to an embodiment of the EUV lithography apparatus wherein an evaluation unit is provided, which determines an instantaneous number of particles in the test region or a temporal profile of the number of particles in the test region from scattered radiation detected in one detection interval or from scattered radiation detected in a plurality of temporally successive detection intervals. Determining the number of particles in the test region captured by the camera by the evaluation unit provides a particularly useful indicator for the particle situation in the test region. The instantaneous number of particles determined and especially the determined temporal profile of the number of particles in the test region is a useful guide to the contamination state of the EUV lithography apparatus.

The instantaneous number of particles or the temporal profile of the number of particles is typically determined in the evaluation unit by computer algorithms which examine an individual detector recording or camera recording or a plurality of detector recordings or camera recordings for regions which can be distinguished from the background of the camera recording and can be delimited from one another. The camera recordings can also be inspected with regard to the particle size, such that it is possible to determine not only the number of particles (instantaneous number of particles or the temporal profile thereof) but also a (if appropriate relative) distribution of the particle sizes previously found on the basis of the area of the delimitable regions of the camera recordings (scattering diameters). If both indications about the instantaneous or temporal situation of the number of particles and indications about the instantaneous or temporal situation of the particle sizes are present, then the state of the EUV lithography apparatus, in particular the contamination thereof by the particles, can be assessed particularly well.

One preferred development of the EUV lithography apparatus additionally comprises a protective device for protecting optical surfaces in the EUV lithography apparatus, which can be activated when a predefined threshold value of the number of particles is exceeded. The protective device can advantageously protect the EUV lithography apparatus if the particle situation in the EUV lithography apparatus were problematic for the optical surfaces owing to the presence of too many particles or possibly particles that are too large.

This hazardous situation generally occurs when a predefined threshold value of the number of particles is exceeded. The check as to whether the determined number of particles or particle size exceeds the threshold value can be carried out by a comparison device, which can be integrated for example into the evaluation unit. Empirical values for a problematic degree of contamination can be used for defining the threshold value. If such empirical values for the problematic degree of contamination are not known, initially low and then higher values can be fixed for the threshold value.

In addition or as an alternative to activating the protective device when a threshold value of the number of particles is exceeded, the protective device can, if appropriate, also be activated if the temporal profile of the number of particles indicates that a drastic increase in the number of particles can be expected, for example if the difference between numbers of particles determined in two or more successive detection intervals exceeds a threshold value. In this case, the protective device can, if appropriate, already be activated before the predefined threshold value of the number of particles is reached.

After the protective measures have been initiated, firstly the contamination source can be located if the cause of the contaminations is not known. Afterwards, the contamination source found can be eliminated, with the result that the degree of contamination is reduced and falls below the predefined threshold value. By way of example, operating personnel can be made aware of the hazardous situation by a warning sound being triggered when the threshold value is exceeded, with the result that the contamination source can be detected and, if appropriate, eliminated.

The optical surfaces of the EUV lithography apparatus which are intended to be protected are in particular mirror surfaces of optical elements which are arranged in an illumination system or a projection system of the lithography apparatus, for example, or the optical surface of the mask or of the wafer. One possible protective device can be a pump, for example, which, by extraction by suction or by introduction of a purge gas, prevents contaminating substances from the gas phase from being deposited onto the surfaces of the optical surfaces.

Preference is given to a development wherein the protective device has an integral or multipartite closure mechanism for separating, in a gastight manner, individual partial regions of the EUV lithography apparatus. By separating a first partial region of the EUV lithography apparatus from a second partial region of the EUV lithography apparatus via the closure mechanism, it is possible, for example, for a disadvantageously high degree of contamination in the first partial region to be restricted to the first partial region, without the high degree of contamination spreading to the second partial region.

The partial region of the EUV lithography apparatus can be, for example, a vacuum chamber having an assembly of the EUV lithography apparatus such as beam shaping system, illumination system or projection system. In this case, an opening provided between the vacuum chambers and serving for the passage of EUV radiation is typically closed. In principle, however, a partial region of the EUV lithography apparatus can also be understood to be a protective region formed by a protective cover or a protective shutter which covers for example optical surfaces in the EUV lithography apparatus and shields them from the surroundings. An example of the conceivable closure mechanism is a (shielding) shutter which covers individual optical elements (e.g. optical elements, etc.), such that particles originating from the contamination source cannot deposit on the optical elements.

In one development, the protective device has a deposition device for covering at least one optical surface with a protective layer. If the optical surfaces are covered with a protective layer, then particles present in the residual gas atmosphere of the respective vacuum chamber cannot deposit on the optical elements and lead to degradation of the optical surfaces. Typically, such protective layers can be removed again in an automated manner (e.g. by applying a cleaning gas), such that subsequent commencement of the operation of the EUV lithography apparatus is possible. A deposition device for depositing a protective layer containing carbon has been disclosed in WO 2009/152885 A1, for example. Such a protective layer containing carbon can be removed from the optical surface by suitable cleaning gases, as described in greater detail in WO 2009/152885 A1.

In one preferred embodiment of the EUV lithography apparatus, the position of the light area produced in the EUV lithography apparatus is variable, e.g. by a light area producing optical unit being equipped with one or more position-variable deflection elements. The statement made about the particle situation in the EUV lithography apparatus (or about the probabilities of the whereabouts of particles in partial regions of the EUV lithography apparatus) can be improved by the variability of the position of the light area. By way of example, if the interior of an EUV lithography apparatus (or a partial region of an EUV lithography apparatus) is spatially "scanned" by step-by-step parallel displacement of the light area, this gives rise to a particularly precise picture regarding the contamination state of the interior or of the scanned partial region of the EUV lithography apparatus: it is thereby possible, for example, to detect locally increasing or decreasing numbers of particles (contamination gradients). This additionally allows localization of possibly unknown contamination sources in the interior or in the scanned partial region of the EUV lithography apparatus and, possibly in a targeted manner, prevention of contaminating particles from flowing in or contaminants from arising at the originating location.

The variability of the position of the light area need not necessarily be implemented by parallel displacement of the light area, rather that other position changes, such as rotation or pivoting of the light area about a rotation axis, for example, are also possible, which can be realized by a suitably designed light area producing optical unit for the radiation, typically provided by a laser in this case.

Preference is furthermore given to an embodiment of the EUV lithography apparatus wherein the test region is provided in a beam shaping system of the lithography apparatus or an illumination system of the lithography apparatus or a projection system of the lithography apparatus. By means of such an arrangement of the test region, the number of particles can be determined within a respective vacuum environment of the optical elements arranged there and, if appropriate, the flow directions of the particles can also be tracked, in particular if the position of the light area is varied in order to examine a test volume. The abovementioned systems possibly contain sources of contaminants, for example pivoting devices for mirror elements or the EUV radiation source, such that the arrangement of the test region in these systems is particularly useful.

Preference is also given to an embodiment of the EUV lithography apparatus wherein the test region is provided between a beam shaping system and an illumination system of the EUV lithography apparatus, between an illumination system or a projection system and a mask of the EUV lithography apparatus or between the projection system and a substrate (wafer) to be patterned or wafer stage.

Typically, the beam shaping system has an EUV light source, which generates contaminants in the form of tin particles, in particular, which can propagate into the illumination system in particular via the intermediate focus provided between the beam shaping system and the illumination system. A test region arranged between the illumination system and the beam shaping system makes it possible to identify an increase in the degree of contamination (an exceedance of the threshold value of the number of particles) by particles in this region and to separate the illumination system in a gastight manner relative to the beam shaping system.

By means of an arrangement of the test region in the region of a mask interface of the lithography apparatus, i.e. between the projection system or the illumination system and the mask, the mask ("reticle"), which is particularly expensive to produce, can be protected against excessively severe contamination by particles. Accordingly, when the test region is provided between a projection system of the lithography apparatus and a substrate to be patterned or a mount for a substrate ("wafer") to be patterned, the latter can be protected against contamination by particles. For shielding the mask or the wafer by closing an opening provided there, the test region need not necessarily be formed in the region of the mask or of the wafer. By way of example, the mask can also be shielded if an excessively large number of particles is detected in the illumination system or in the projection system.

In a further embodiment, the test region is formed at an intermediate focus produced, for example, between the beam shaping system and the illumination system. Since, in the region of an intermediate focus, the beam path of the EUV radiation typically (approximately) forms a light area, without an additional beam shaping optical unit being required, the radiation generated by the EUV light source can particularly preferably be used there for the illumination of the particles. Moreover, a sufficiently high radiation power for illuminating the particles is also present in the region of an intermediate focus.

The object is also achieved by means of a method for detecting particles in an EUV lithography apparatus comprising the following method steps:

a.) producing a light area for illuminating the particles present in the gas phase, b.) detecting radiation scattered at the illuminated particles in a test region, and c.) determining a number of particles in the test region on the basis of the detected radiation. The method according to the invention advantageously enables a statement to be made about particles present in the EUV lithography apparatus, in particular about the number of particles. As explained further above, the number of particles in the test region is typically implemented in an evaluation unit with the aid of suitable image evaluation algorithms. With regard to the advantages of the method, reference is made at this point to the explanations given above in connection with the EUV lithography apparatus.

In one preferred method variant, the production of the light area for illuminating particles present in the gas phase in the EUV lithography apparatus is carried out in, in particular periodically, successive illumination intervals. As a result, the statement made about the number of particles in the EUV lithography apparatus is not restricted to a single viewing instant, rather a plurality of temporally successive viewing instants can be captured. In particular, by choosing a sufficiently high frequency of the illumination intervals, it is possible to ensure that the number of particles in the EUV lithography apparatus does not increase to an excessively great extent between two viewing instants/illumination intervals, without suitable countermeasures being able to be implemented.

In the method, the time intervals for generation of radiation by the light source (illumination intervals) are advantageously synchronized with time intervals in which the detector makes a recording of the light area or of the particles (detection intervals). This synchronization (of method step a.) with method step b.)) ensures that the successive light area productions temporally coincide with the successive camera recordings and do not fall out of phase. In principle, the determination of the number of particles on the basis of the detected radiation (or on the basis of the camera recording or camera recordings) can be effected in each case after the detection of the scattered radiation. If appropriate, however, it is also possible to wait a plurality of camera recordings (detection intervals) before the evaluation takes place (so-called "postprocessing").

In a further variant of the method according to the invention, light areas produced in different illumination intervals are spatially offset in order to pervade a test volume. In this way, the test region captured by the detector can be enlarged and extended to a test volume.

One preferred method variant furthermore comprises initiating a measure for protecting optical surfaces of the EUV lithography apparatus as soon as the determined number of particles exceeds a predefined threshold value. Various measures can be provided for the protection of the optical surfaces (also on the wafer and/or recticle):

In one method variant, for protecting at least one optical surface of the EUV lithography apparatus, individual partial regions of the EUV lithography apparatus are separated from one another in a gastight manner. In particular, in this case openings in vacuum chambers in which e.g. a beam shaping system, an illumination system or a projection system are provided can be closed in a gastight manner. In this way, optical surfaces provided in the vacuum chambers and also optical surfaces provided outside said vacuum chambers (e.g. on the mask and/or on the wafer) can be protected against contaminating particles.

In a further method variant, for protecting at least one optical surface of the EUV lithography apparatus, the optical surface is covered with a protective layer. If an optical surface is covered with such a protective layer, particles suspended in the gas phase can deposit only on the protective layer and no longer on the optical surface itself. Typically, such protective layers can be removed again easily in an automated manner, by being brought into contact with a cleaning gas, e.g. (activated) hydrogen or oxygen, which converts the protective layer together with the particles deposited thereon into the gas phase and thus removes them. If appropriate, in this case it is also possible to remove particles which had already deposited on the optical surface before the protective layer was applied.

Further features and advantages of the invention are evident from the following description of exemplary embodiments of the invention, with reference to the figures of the drawing, which show details essential to the invention, and from the claims. The individual features can be realized in each case individually by themselves or as a plurality in any desired combination in a variant of the invention.

BRIEF DESCRIPTION OF THE DRAWINGS

Exemplary embodiments are illustrated in the schematic drawing and are explained in the following description. In the figures.

DETAILED DESCRIPTION

Figure 1:
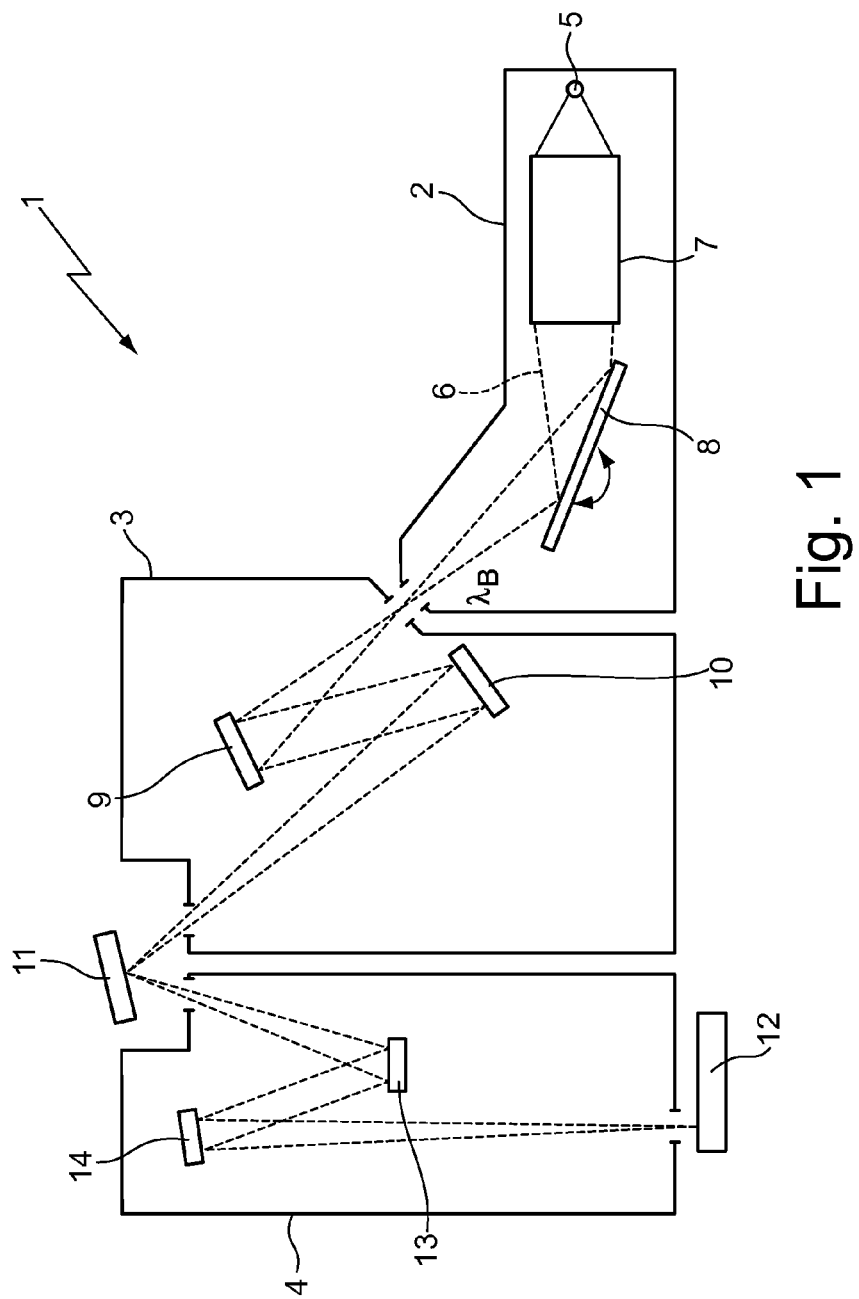
FIG. 1 shows a schematic illustration of an EUV lithography apparatus.

In the following description of the drawing, identical reference signs are used for identical or functionally identical components.

In FIG. 1, an EUV lithography apparatus is designated schematically by 1. The EUV lithography apparatus 1 has a beam generating system 2, an illumination system 3 and a projection system 4, which are accommodated in separate (vacuum) housings and arranged successively in a beam path 6 proceeding from an EUV light source 5 of the beam generating system 2. The beam generating system 2, the illumination system 3 and the projection system 4 are arranged in a vacuum housing (not illustrated) surrounding these systems. By way of example, a plasma source can serve as the EUV light source 5.

The radiation emerging from the light source 5 in the wavelength range of between approximately 5 nm and approximately 20 nm is firstly concentrated in a collimator 7. With the aid of a downstream monochromator 8, the desired operating wavelength $\lambda_B$, which is approximately 13.5 nm in the present example, is filtered out by variation of the angle of incidence, as indicated by a double-headed arrow. The collimator 7 and the monochromator 8 are embodied as reflective optical elements.

The radiation treated with regard to wavelength and spatial distribution in the beam generating system 2 is introduced into the illumination system 3, which has a first and second reflective optical element 9, 10. The two reflective optical elements 9, 10 direct the radiation onto a photomask 11 as further reflective optical element, which has a structure that is imaged onto a wafer 12 on a reduced scale by means of the projection system 4. For this purpose, a third and fourth reflective optical element 13, 14 are provided in the projection system 4.

The reflective optical elements 9, 10, 11, 13, 14 each have an optical surface that is subjected to the EUV radiation 6 from the light source 5. In this case, the optical elements 9, 10, 11, 13, 14 are operated under vacuum conditions, i.e. at (total) pressures of between $10^{-9}$ mbar and $10^{-1}$ mbar. Nevertheless, contaminating substances, in particular contaminating particles, stay in the interior of the EUV lithography apparatus 1 (for example in the beam shaping system 2, in the illumination system 3 or in the projection system 4).

The contaminating substances can originate from different sources or have different original causes. The EUV light source 5 can be a plasma light source, for example, wherein droplets of molten tin are bombarded by a pulsed carbon-dioxide high-power laser, as a result of which tin particles can pass into the surroundings of the light source 5 and subsequently propagate in the beam shaping system 2. Furthermore, the monochromator 8 is mounted in a mechanically pivotable manner in the beam shaping system 2, as indicated by the double-headed arrow. In the course of mechanical pivoting, however, mechanical abrasion can be established, which likewise leads to the formation of contaminating particles.

Moreover, the optical elements 9, 10 provided in the illumination system 3 can be facet mirrors having a plurality of tiltable individual mirrors, in the course of the movement of which possibly likewise contaminating particles are released into the residual gas atmosphere present there. Components provided in the respective vacuum housings 2, 3, 4 or the wafer 12 can also possibly release contaminating particles.

All these particles can deposit in individual assemblies of the EUV lithography apparatus 1 (or optical surfaces present there) and migrate from one assembly (e.g. the beam shaping system 2) to the next (e.g. the illumination system 3) and have a disadvantageous effect on the operation of the EUV lithography apparatus 1. The contaminating substances can be heavy hydrocarbons in the gas phase, for example, which deposit as solid carbon on the surfaces of the optical elements 9, 10, 11, 13, 14, under irradiation with EUV light 6, as a result of which the reflectivity of the optical elements 9, 10, 13, 14 disadvantageously decreases.

For detecting particles present in the EUV lithography apparatus 1, a laser light source 15 (illustrated in greater detail in FIG. 2) and as a detector a camera 16 (likewise described in greater detail in FIG. 2) are arranged in the illumination system 3. The laser light source 15 is designed for generating laser radiation 17 for the illumination of particles P present in the gas phase in the EUV lithography apparatus 1 along a light area 18. The camera 16 is designed for detecting radiation 17a from the laser light source 15 that is scattered at the illuminated particles P, in a test region 19 captured by the camera 16. The light area 18 is generated by means of the laser light source 15 and a light area producing optical unit 20, said light area extending in a plane perpendicular to the plane of the drawing in FIG. 2. Particles P present in the gas phase which stay in the plane of the light area 18 are illuminated by the radiation 17 from the laser light source 15 and scatter the radiation 17 from the laser light source 15. In this case, the particles P are situated in a residual gas atmosphere (i.e. in the gas phase) present in the EUV lithography apparatus 1 or the illumination system 3.

Figure 2:
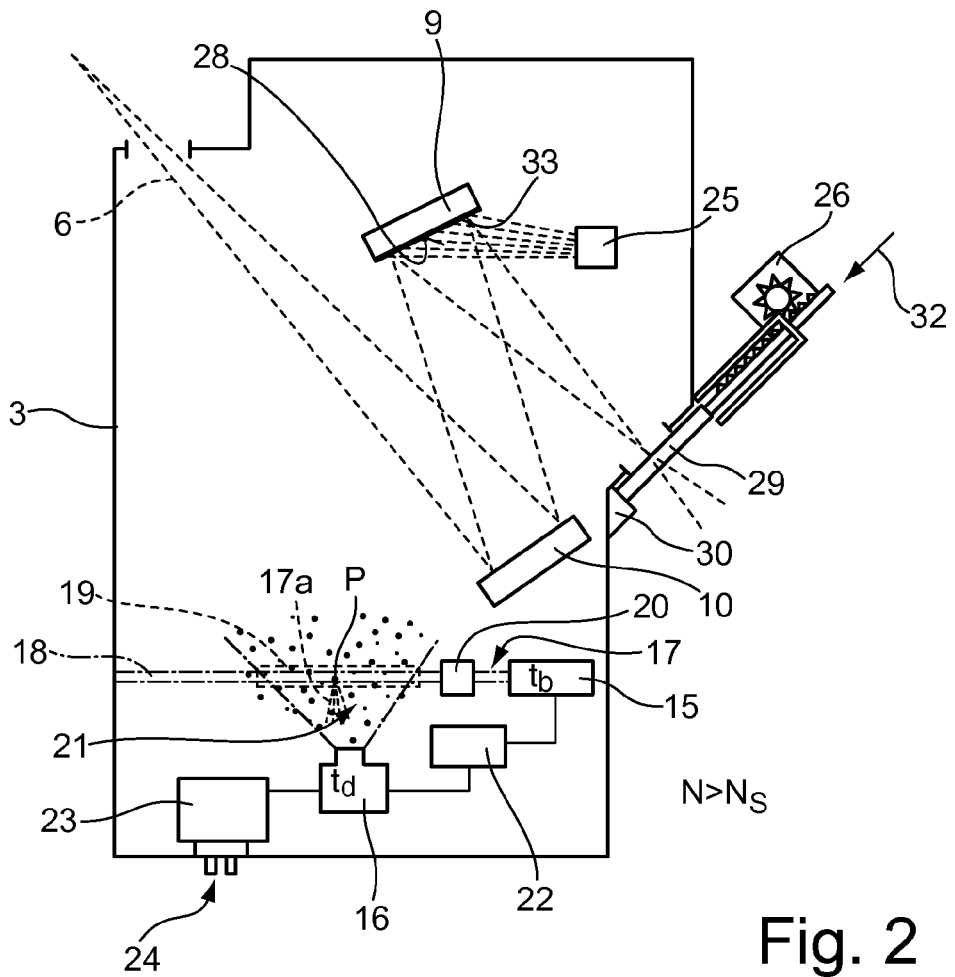
FIG. 2 shows an enlarged excerpt of an illumination system of an EUV lithography apparatus with—arranged therein—a laser light source and a camera for particle detection.

The camera 16 can detect the radiation 17a scattered at the illuminated particles P and, for this purpose, has a (delimited) capture region 21 (represented by the aperture angle of the field of view of the camera of approximately 90° in FIG. 2). The capture region 21 and the light area 18 overlap in a region that forms the test region 19.

The light area producing optical unit 20 provided is an optical unit which fans out radiation 17 emitted by the laser light source 15 into a thin sheet (typically between approximately 1 mm and 10 mm, generally not greater than the depth of field of the camera 16 used) and thus forms the light area 18. The light area 18 is an (approximately) two-dimensional plane which, if appropriate, can also have smaller thicknesses than those indicated above, e.g. a thickness of approximately 0.05 mm. The light area producing optical unit 20 typically comprises a spherical lens (not illustrated in greater detail here) and a cylindrical lens. The cylindrical lens expands the laser beam 17 in a plane and the spherical lens collimates the fanned-out laser radiation for shaping the thin light sheet or light area 18. The camera 16 is typically coordinated with the wavelength range of the radiation 17 from the laser light source 15 (the sensitivity of the camera 16 depends, inter alia, on the type of camera (e.g. CCD or CMOS)). With such a camera 16, it is possible to detect small particles (diameters of down to 250 nm in size, in particular cases even down to 60 nm in size) if the laser light source 15 has a sufficiently high laser power.

Since, during the detection of the particles in the gas phase, the camera 16 captures the so-called scattering diameter rather than the real particle diameter and said scattering diameter is dependent, inter alia, on the ratio of the particle diameter to the wavelength of the radiation 17 from the light source 15, the wavelength emitted by the laser light source 15 should be suitably adapted. In the present case, the laser light source 15 is a pulsed Nd:YAG laser having a wavelength of 532 nm, which has proved to be advantageous for the present applications. The laser light source 15 has a high power and, together with the light area producing optical unit 20, leads to the production of a very thin light sheet 18. The high radiation power also has the effect that (in combination with a suitable camera 16 (see above)) particularly small particles (sizes of approximately 250 nm or even approximately 60 nm) are detectable.

Furthermore, a synchronization device 22 for synchronizing detection intervals $t_d$ of the camera 16 with illumination intervals $t_b$ of the laser light source 15 is provided between the camera 16 and the laser light source 15. The synchronization device 22 temporally synchronizes successive camera recordings with successive light area productions of the laser light source 15, that is to say that they have a fixed phase relationship and generally an identical frequency. The camera recordings (detection intervals $t_d$) can be chosen to be significantly longer than the light area productions (illumination intervals $t_d$) ($t_d \gg t_B$). In this way, the integration time is increased and the signal-to-noise ratio is improved. A particle should be perceived as stationary by the camera 16 during the detection interval $t_d$ and therefore should not move across a plurality of different pixels of the camera 16 during the detection interval $t_d$. Therefore, the detection interval $t_d$ should not exceed a time duration which corresponds to the quotient of the longitudinal extent of a pixel of the camera 16 and the velocity of a respective detected particle (relative to the detection area of the camera).

For evaluating the camera recordings, an evaluation unit 23 is arranged in the region of the camera 16, said evaluation unit being signal-connected to the camera 16 and the synchronization device 22 and the laser light source 15. The evaluation unit 23 is able to determine, from scattered radiation 17a detected in one detection interval $t_d$ or from scattered radiation 17a detected in a plurality of temporally successive detection intervals $t_d$, an instantaneous number N of particles in the test region 19 or (in the case of a plurality of successive detection intervals $t_d$) a temporal profile of the number N of particles in the test region 19. The instantaneous number N of particles or the temporal profile of the number N of particles is typically determined in the evaluation unit 23 by means of computer algorithms which examine the individual camera recording or the plurality of camera recordings for regions which differ on account of contrast from the image background of the camera recording and which can be delimited from further regions. A respective delimitable region is in each case identified with a detected particle.

Typically, the light area production is effected periodically, i.e. in a pulsed manner, and the camera 16, in a manner controlled by the synchronization device 22, continuously records the radiation 17a scattered by the particles P in the individual illumination intervals $t_B$. The continuous camera recordings are evaluated by the evaluation unit 23 with regard to the number N of particles during an illumination interval $t_B$ (or a corresponding detection interval $t_d$). It is furthermore possible for the evaluation unit 23 also to evaluate the camera recordings with regard to different scattering cross sections and also, if appropriate, with regard to particle sizes correlated with the scattering cross sections.

As a result of the production of a (thin) light area 18, the number of illuminated particles P is comparatively small, thus facilitating the discrimination or the determination of the number N of particles. The results of the evaluation unit 23 can be passed via a data interface 24, which has electrical contacts, out of the illumination system 3 and subjected to further signal processing. Moreover, the transmitted data can be visualized for the operator in a display device (e.g. a display).

Both the evaluation unit 23, the camera 16 and also the laser light source 15 need not be arranged in the illumination system 3 itself. In order to enable the feeding of radiation 17 from the laser light source into the illumination system 3 and/or the detection of the scattered radiation 17a by means of the camera 16, inspection windows can be provided in the illumination system 3. An optical waveguide, e.g. an optical fiber, can also be provided for feeding laser radiation to the illumination system 3.

If contaminating particles P arise in the interior of the EUV lithography apparatus 1 (for example in the illumination system 3) in the manner described above, said particles can be distributed uniformly in the interior of the EUV lithography apparatus 1 (e.g. in the illumination system 3) on account of thermal agitation, and so with a certain probability they also stay in the test region 19. If a purge gas flow is generated in the lithography apparatus 1 (e.g. the illumination system) in order to keep particles P away from the optical elements 9, 10, conclusions about the effectiveness of such a purge gas flow can be drawn as a result of the detection of the particles P.

The position of the light area 18 generated by the light area producing optical unit 20 can be variable; by way of example, a parallel displacement of the light area 18 in the interior of the illumination system 3 in a spatial direction perpendicular to the light area 18 is possible if the light area producing optical unit 20 is equipped with suitable beam deflecting devices. As a result of the variability of the position of the light area 18, the scattering of radiation can take place not only at particles P which stay at the (fixed) position of the two-dimensional light area 18, but also at particles situated in the three-dimensional (test) volume traversed by the light area 18 during the (parallel) displacement. This increases the accuracy of the statement made about the particle situation in the EUV lithography apparatus 1, such that it is possible to establish a particularly precise picture regarding the contamination state of the EUV lithography apparatus 1. In particular, in this way it is possible to detect locally increasing or decreasing numbers of particles (or contamination gradients) and it is possible to localize contamination sources in the interior, to put it more precisely in the monitored test region or test volume of the EUV lithography apparatus 1.

The particle detection described above makes it possible to determine the state of the EUV lithography apparatus 1 with regard to the number N of particles in the test region 19. If the number N of particles in the test region 19 exceeds a predetermined threshold value $N_S$, then it is possible to implement countermeasures for protecting the EUV lithography apparatus 1, to put it more precisely optical elements 9, 10, 13, 14 provided there, the mask 11 and/or the wafer 12. The check as to whether the determined number N of particles (if appropriate in conjunction with a specific particle size) exceeds the threshold value $N_S$ can be carried out by a comparison device (not illustrated), which can be integrated for example into the evaluation unit 23.

Empirical values for a degree of contamination that is problematic for the EUV lithography apparatus 1 or in the respective test region 19 can be used for stipulating the threshold value $N_s$. Countermeasures can, if appropriate, also already be initiated before the threshold value $N_S$ is exceeded, e.g. if the number N of particles rises significantly in two or more successive detection intervals $t_d$, such that it is very probable that the limit value $N_S$ will be exceeded in a subsequent detection interval $t_d$.

As a countermeasure for protecting the EUV lithography apparatus 1 when the limit value is exceeded (i.e. in the case of $N>N_S$, cf. FIG. 2), it is possible to activate a protective device designed as a closure mechanism, for example as a slide 29. In the state illustrated in FIG. 2, the slide 29 is extended to a stop 30 of the illumination system 3, such that it closes off the vacuum housing of the illumination system 3 in a sealing manner and separates it from the surroundings, in particular the beam shaping system 2. For moving the slide 29 from an open position into the separating position (in the direction of the arrow 32), and vice versa, an electric drive 26 (motor) can be provided, for example. As a result of the separability of the beam shaping system 2 from the illumination system 3 as a result of the closure of the opening provided in this region, a high degree of contamination in the beam shaping system 2 (cf. FIG. 1), caused e.g. by tin particles, can be restricted to the beam shaping system 2, without said degree of contamination affecting the illumination system 3 or the optical surfaces present there, of which an optical surface 28 of the first optical element 9 is illustrated by way of example in FIG. 2.

A closure mechanism can alternatively or additionally also be arranged in the region of the mask 11, i.e. for example in the region of the opening shown in FIG. 1 between the illumination system 3 and the mask 11 and/or between the mask 11 and the opening for the entry of the EUV radiation 6 into the projection system 4, in order to restrict contaminations occurring in the individual systems 3, 4 to the latter. A closure mechanism, e.g. a slide, can also be provided in the region of the opening at the beam exit of the projection system 4 upstream of the wafer 12. The closure mechanism can serve for protecting the wafer 12 against particle contaminations from the interior of the projection system 4 and/or for protecting the optical elements 13, 14 arranged in the projection system 4 against particles produced in the region of the wafer 12.

A closure mechanism in the manner of a slide, for example, can also be provided for protecting an individual optical surface 28 and can be activated e.g. when the predefined threshold value $N_S$ of the number N of particles is exceeded. The closure mechanism (e.g. a further slide) can, as is shown in FIG. 2 for the entrance opening of the illumination system 3, be arranged near the optical surface 28 and be displaced, e.g. by means of an electric motor 26, in front of the optical element 9 until it bears against an e.g. frame-shaped stop, such that a protective partical region (cover) is formed between the optical surface 28 of the optical element 9 and the slide. By virtue of such a cover, particles P originating from a contamination source can no longer deposit on the optical surface 28. A closure mechanism or a cover can be provided not only at the first optical element 9, but rather at all the optical elements 9, 10, 11, 13, 14 of the EUV lithography apparatus 1.

A further possibility for protecting an optical surface against the deposition of particles is shown by way of example for the first optical element 9 of the illumination system 3 in FIG. 2. A deposition device 25 serves there for applying a protective layer 33, e.g. a carbon layer, to the optical surface 28 of the first optical element 9. The protective layer 33 is deposited, as indicated in FIG. 2, by means of a particle beam produced with the aid of the deposition device 25, as is described in WO 2009/152885 A1, which is incorporated by reference in the content of this application.

Figure 3:
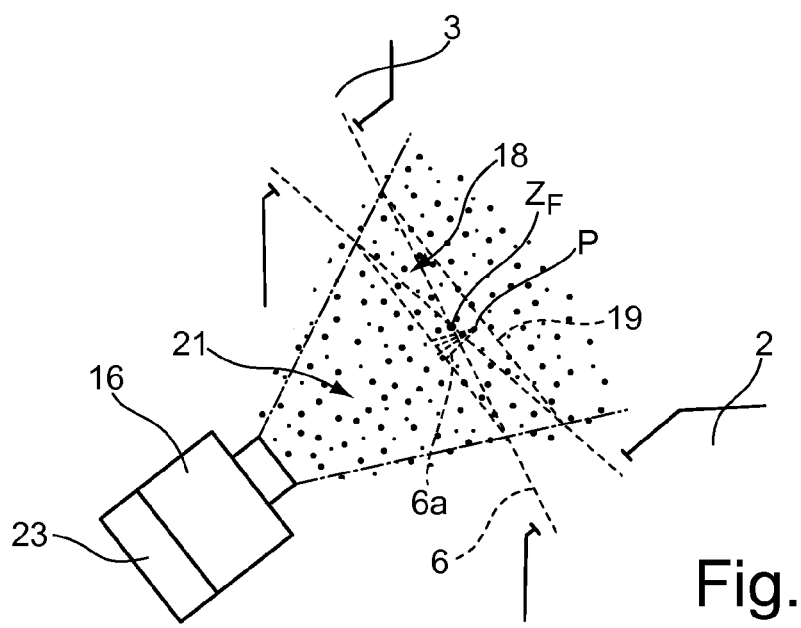
FIG. 3 shows an excerpt from an EUV lithography apparatus with a camera for particle detection at an intermediate focus.

FIG. 3 illustrates as an excerpt the beam path 6 in the region of an intermediate focus $Z_F$ between the beam shaping system 2 and the illumination system 3 of an EUV lithography apparatus 1. The light area 18, along which particles P present in the gas phase are illuminated, is not produced by a separate light source in FIG. 3, but rather by the beam path 6 of the beam generating system 2 which proceeds from the EUV light source 5 and which is used for producing a structure on the wafer 12. This is possible, inter alia, since the intensity of the EUV radiation 6 is particularly high in the region of the intermediate focus $Z_F$, which has an advantageous effect on detection. The particle detection can, if appropriate, also be carried out elsewhere in the beam path of the EUV radiation 6.

The radiation 6a scattered at the illuminated particles P is captured by a camera 16, as shown in FIG. 2, said camera having a capture region 21 determined by its viewing angle. Said capture region 21 is aligned with the light area 18 and intersects the light area 18 in the test region 19. As in FIG. 2, an evaluation unit 23 is provided for evaluating the camera recording or the camera recordings. The scattered radiation 6a is typically EUV radiation, but it is also possible, if appropriate, for the wavelength of the scattered radiation to differ from the EUV wavelength. The camera 16 is designed for the detection of EUV radiation 6 or has a detector area that is sensitive to EUV radiation.

In the case of the EUV lithography apparatus described above, a statement about particles present in the EUV lithography apparatus can advantageously be made. In particular, the contamination of optical surfaces provided on mirrors, on the mask and/or on the wafer can be counteracted on the basis of the detected particles.

The above description of various embodiments has been given by way of example. From the disclosure given, those skilled in the art will not only understand the present invention and its attendant advantages, but will also find apparent various changes and modifications to the structures and methods disclosed. It is sought, therefore, to cover all such changes and modifications as fall within the spirit and scope of the invention, as defined by the appended claims, and equivalents thereof.

The invention claimed is:

1. EUV lithography apparatus, comprising:
   a light source for generating radiation for the illumination of particles present in the gas phase and present in the EUV lithography apparatus along a substantially two-dimensional light area, and
   a detector for detecting radiation from the light source that is scattered at the illuminated particles, wherein the detector comprises a capture region that intersects the substantially two-dimensional light area in a test region, and wherein the detector generates a spatially resolved image of individual particles within the test region to detect the particles present in the test region.

2. EUV lithography apparatus according to claim 1, wherein the light source is a laser.

3. EUV lithography apparatus according to claim 1, wherein the light source is an EUV light source of the EUV lithography apparatus for producing a structure on a substrate.

4. EUV lithography apparatus according to claim 1, wherein the light source is designed to produce a plurality of light areas in successive illumination intervals, in particular in pulsed operation.

5. EUV lithography apparatus according to claim 4, wherein a position of the light area produced in the EUV lithography apparatus is variable.

6. EUV lithography apparatus according to claim 4, further comprising: a synchronization device for synchronizing detection intervals of the detector with the illumination intervals.

7. EUV lithography apparatus according to claim 1, further comprising: an evaluation unit, which determines an instantaneous number of particles in the test region or a temporal profile of the number of particles in the test region from scattered radiation detected in one detection interval or from scattered radiation detected in a plurality of temporally successive detection intervals.

8. EUV lithography apparatus according to claim 7, further comprising: a protective device for protecting optical surfaces in the EUV lithography apparatus, which can be activated when a predefined threshold value of the determined number of particles is exceeded.

9. EUV lithography apparatus according to claim 8, wherein the protective device has a closure mechanism for separating individual partial regions of the EUV lithography apparatus.

10. EUV lithography apparatus according to claim 8, wherein the protective device has a deposition device for covering at least one optical surface by means of a protective layer.

11. EUV lithography apparatus according to claim 1, wherein the test region is provided in a beam shaping system, an illumination system or a projection system of the EUV lithography apparatus.

12. EUV lithography apparatus according to claim 1, wherein the test region is provided between a beam shaping system and an illumination system of the EUV lithography apparatus, between an illumination system or a projection system and a mask of the EUV lithography apparatus or between the projection system and a substrate to be patterned.

13. EUV lithography apparatus according to claim 1, wherein the test region is provided on an intermediate focus.

14. The apparatus of claim 1, wherein the detector comprises a camera, and wherein a thickness of the light area is within a depth of field of the camera.

15. Method for detecting particles in an EUV lithography apparatus comprising:
   a. producing a light area for illuminating the particles present in the gas phase,
   b. detecting radiation scattered at the illuminated particles in a substantially two-dimensional test region, from a capture region that intersects the substantially two-dimensional light area,
   c. generating a spatially resolved two dimensional image of individual particles in the test region to detect particles present in the test region, and
   d. determining a number of particles in the test region on the basis of the spatially resolved two dimensional image.

16. Method according to claim 15, wherein the production of the light area is carried out in a plurality of, in particular periodically, successive illumination intervals.

17. Method according to claim 16, wherein light areas produced in different illumination intervals are spatially offset in order to pervade a test volume.

18. Method according to claim 15, further comprising: initiating a measure for protecting optical surfaces of the EUV lithography apparatus as soon as the determined number of particles exceeds a predefined threshold value.

19. Method according to claim 18, wherein, for protecting optical surfaces of the EUV lithography apparatus, partial regions of the EUV lithography apparatus are separated from one another in a gastight manner.

20. Method according to claim 18, wherein, for protecting at least one optical surface, the optical surface is covered with a protective layer.

21. EUV lithography apparatus according to claim 1, wherein the detector is a camera.

22. The method of claim 15, wherein detecting radiation comprises detecting radiation with a camera, and wherein producing the light area comprises producing the light area such that a thickness of the light area is within a depth of field of the camera.

* * * * *